United States Patent
Nishio et al.

(10) Patent No.: US 11,351,753 B2
(45) Date of Patent: Jun. 7, 2022

(54) ELECTROMAGNETIC WAVE TRANSMISSIVE METAL MEMBER, ARTICLE USING THE SAME, AND PRODUCTION METHOD FOR ELECTROMAGNETIC WAVE TRANSMISSIVE METAL FILM

(71) Applicant: NITTO DENKO CORPORATION, Ibaraki (JP)

(72) Inventors: Hajime Nishio, Ibaraki (JP); Hironobu Machinaga, Ibaraki (JP); Kazuto Yamagata, Ibaraki (JP); Masaharu Arimoto, Ibaraki (JP); Xiaolei Chen, Ibaraki (JP); Rie Hayashiuchi, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 285 days.

(21) Appl. No.: 16/313,338

(22) PCT Filed: Jun. 28, 2017

(86) PCT No.: PCT/JP2017/023734
§ 371 (c)(1),
(2) Date: Dec. 26, 2018

(87) PCT Pub. No.: WO2018/003847
PCT Pub. Date: Jan. 4, 2018

(65) Prior Publication Data
US 2019/0315093 A1    Oct. 17, 2019

(30) Foreign Application Priority Data
Jun. 30, 2016 (JP) .............................. JP2016-130450

(51) Int. Cl.
*B32B 15/01* (2006.01)
*B32B 15/08* (2006.01)
(Continued)

(52) U.S. Cl.
CPC ............. *B32B 15/01* (2013.01); *B32B 15/08* (2013.01); *B60R 19/52* (2013.01); *C08J 5/18* (2013.01);
(Continued)

(58) Field of Classification Search
CPC ......... B32B 15/01; B32B 15/08; B32B 15/04; B60R 19/52; B60R 2019/525; C08J 5/18;
(Continued)

(56) References Cited

U.S. PATENT DOCUMENTS

| 6,328,358 B1 | 12/2001 | Berweiler |
| 8,455,086 B2 | 6/2013 | Inuduka et al. |

(Continued)

FOREIGN PATENT DOCUMENTS

| CN | 101590706 A | 12/2009 |
| CN | 102483480 A | 5/2012 |

(Continued)

OTHER PUBLICATIONS

The extended European search report dated Jan. 22, 2020 for corresponding European Application No. 17820201.6.
(Continued)

*Primary Examiner* — Daniel J. Schleis
*Assistant Examiner* — Kevin C T Li
(74) *Attorney, Agent, or Firm* — Hauptman Ham, LLP

(57) ABSTRACT

Provided is an electromagnetic wave transmissive metal member capable of being easily produced at a low production cost, with both a metallic luster and an electromagnetic wave transmissibility, an article using the electromagnetic wave transmissive metal member, and a production method
(Continued)

for an electromagnetic wave transmissive metal film. The electromagnetic wave transmissive metal member comprises a metal layer and a crack layer, wherein the metal layer and the crack layer have, in their respective planes, a plurality of linear cracks extending substantially parallel to each other. The linear cracks in the metal layer and the linear cracks in the crack layer penetrate through their respective layers in a thickness direction, and are continuous with each other in the thickness direction.

23 Claims, 6 Drawing Sheets

(51) Int. Cl.

| | | |
|---|---|---|
| *B60R 19/52* | (2006.01) | |
| *C08J 5/18* | (2006.01) | |
| *C23C 14/34* | (2006.01) | |
| *C23C 14/56* | (2006.01) | |
| *C23C 28/00* | (2006.01) | |
| *C23C 28/02* | (2006.01) | |
| *G01S 13/93* | (2020.01) | |
| *G01S 7/03* | (2006.01) | |
| *H01Q 1/32* | (2006.01) | |
| *G01S 13/931* | (2020.01) | |

(52) U.S. Cl.
CPC ............ *C23C 14/34* (2013.01); *C23C 14/562* (2013.01); *C23C 28/021* (2013.01); *C23C 28/321* (2013.01); *C23C 28/34* (2013.01); *G01S 7/03* (2013.01); *G01S 13/931* (2013.01); *H01Q 1/3233* (2013.01); *B60R 2019/525* (2013.01)

(58) Field of Classification Search
CPC ..... C23C 14/34; C23C 14/562; C23C 14/024; C23C 14/205; C23C 14/5886; C23C 28/021; C23C 28/321; C23C 28/34; G01S 7/03; G01S 13/931; G01S 13/93; H01Q 1/3233
See application file for complete search history.

(56) References Cited

U.S. PATENT DOCUMENTS

| | | | |
|---|---|---|---|
| 9,305,680 B2* | 4/2016 | Yamazaki | ............. C23C 14/086 |
| 2009/0297880 A1 | 12/2009 | Maruoka et al. | |
| 2012/0076986 A1* | 3/2012 | Inuduka | ................... B32B 7/12 |
| | | | 428/156 |
| 2013/0248091 A1 | 9/2013 | Inuduka et al. | |
| 2016/0237549 A1 | 8/2016 | Hara et al. | |

FOREIGN PATENT DOCUMENTS

| | | | | | |
|---|---|---|---|---|---|
| JP | 2000-159039 A | | 6/2000 | | |
| JP | 2003-69282 A | | 3/2003 | | |
| JP | 2006-3909 A | | 1/2006 | | |
| JP | 2009-286082 A | | 12/2009 | | |
| JP | 2010-5999 A | | 1/2010 | | |
| JP | 2011-163903 A | | 8/2011 | | |
| JP | 2013-256104 A | | 12/2013 | | |
| JP | 2013256104 A | * | 12/2013 | ......... | C03C 17/3647 |
| JP | 2016-144930 A | | 8/2016 | | |
| KR | 10-2012-0023049 A | | 3/2012 | | |
| WO | 2015050007 A1 | | 4/2015 | | |
| WO | WO-2015050007 A1 | * | 4/2015 | ......... | C23C 14/5886 |

OTHER PUBLICATIONS

International Search Report for corresponding international application PCT/JP2017/023734 dated Aug. 22, 2017.
Office Action issued for corresponding Chinese Patent Application No. 201780038483.6 dated Jul. 1, 2020 (Receipt Date: Jul. 31, 2020), along with an English translation.
Office Action issued for corresponding Japanese Patent Application No. 2018-525204 dated Apr. 1, 2021, along with an English machine translation.
Office Action issued for corresponding Korean Patent Application No. 10-2018-7037715 dated Sep. 27, 2021, along with an English machine translation.
Decision of Refusal dated Oct. 13, 2021, regarding the corresponding Japanese Patent Application No. 2018-525204, together with the English machine translation thereof.
Notice of Final Rejection dated Mar. 28, 2022 for corresponding Korean Patent Application No. 10-2018-7037715, along with an English machine translation.

* cited by examiner

ELECTROMAGNETIC WAVE TRANSMISSIVE METAL MEMBER, ARTICLE USING THE SAME, AND PRODUCTION METHOD FOR ELECTROMAGNETIC WAVE TRANSMISSIVE METAL FILM

CROSS REFERENCE TO RELATED APPLICATION

This application claims the priority of Japanese Patent Application No. 2016-130450, filed on Jun. 30, 2016, in the JPO (Japanese Patent Office). Further, this application is the National Phase Application of International Application No. PCT/JP2017/023734, filed on Jun. 28, 2017, which designates the United States and was published in Japan. Both of the priority documents are hereby incorporated by reference in their entireties.

TECHNICAL FIELD

The present invention relates to an electromagnetic wave transmissive metal member having a metallic luster and an electromagnetic wave transmissibility, an article using the electromagnetic wave transmissive metal member, and a production method for an electromagnetic wave transmissive metal film.

BACKGROUND ART

A metal member having both a metallic luster and an electromagnetic wave transmissibility is needed, for example, to decorate a cover member of a millimeter-wave radar mounted to a front end of an automotive vehicle such as a front grille, an emblem or a bumper.

The millimeter-wave radar is configured to transmit an electromagnetic wave having a millimeter waveband (frequency: about 77 GHz, wavelength: about 4 mm) forwardly with respect to the vehicle, and receive and analyze a reflected wave from a target so as to measure a distance or a direction with respect to the target, or the size of the target. A result of the measurement can be utilized for inter-vehicle distance measurement, automatic vehicle speed adjustment, automatic brake adjustment, etc. The front component of the vehicle to which the millimeter-wave radar is mounted is a portion constituting, so to say, the face of the vehicle, and having a great impact on a user. Thus, it is preferable to create a high-class appearance by a metallic lustrous front decoration. However, if the front component of the vehicle is made of a metal material, it will substantially preclude or hinder the millimeter-wave radar from emitting and receiving an electromagnetic wave. Therefore, in order to prevent hindering of the function of the millimeter-wave radar without spoiling an aesthetic appearance of the vehicle, there is a need for a metal member having both a metallic luster and an electromagnetic wave transmissibility. As one effective solution, there have been proposed some metal members in which a metal layer is discontinuously formed to provide an electromagnetic wave transmissibility by means of resulting discontinuous portions.

For example, in the following Patent Document 1, there is proposed a metal covering in which an indium film is formed on a surface of a substrate in an island pattern by a vacuum vapor deposition process. The indium film formed in an island pattern has a metallic luster, and allows an electromagnetic wave to be transmitted therethrough via gaps defined between adjacent ones of a plurality of islands.

Further, in the following Patent Document 2, there is proposed a method of producing a metal film-decorated sheet through heating treatment. This metal film-decorated sheet is obtained by: preparing a workpiece sheet which comprises a crack-inducing layer formed on a substrate sheet, and a metal film layer made of a specific metal material and formed in contact with the crack-inducing layer; and heating the workpiece sheet at a high temperature (120° C. to 200° C.) while imposing a given tension on the workpiece sheet, thereby forming a plurality of stringlike planar structures divided by cracks.

In the following Patent Document 3, heating treatment is utilized as with the Patent Document 2. In the Patent Document 3, an aluminum (Al) film formed on a resin substrate and a chromium film formed on the aluminum film are heated at a high temperature (120° C.) together with the resin substrate to form a laminate of the aluminum film and the chromium film into a discontinuous structure by means of thermal stress.

In the following Patent Document 4, heating treatment is also utilized. Here, an electroconductive film having a metallic luster is formed on a surface of a substrate by an electroless plating process, and then subjecting the electroconductive film to after-baking, thereby forming island-shaped microcracks for allowing an electromagnetic wave to be transmitted through the electroconductive film.

CITATION LIST

Parent Document

Patent Document 1: JP 2000-159039A
Patent Document 2: JP 2010-005999A
Patent Document 3: JP 2009-286082A
Patent Document 4: JP 2011-163903A

SUMMARY OF INVENTION

Technical Problem

Although a metal member having an electromagnetic wave transmissibility at a level capable of withstanding practical use can be obtained by the technique proposed in the Patent Document 1, this technique leads to high production cost because indium is costly, as pointed out by many documents (e.g., the Patent Document 4).

On the other hand, the techniques proposed in the Patent Documents 2 to 4 using no indium are free from the problem with material cost. However, considerable investment in facility for performing the heating treatment is needed. Moreover, although it is only necessary to spend a relatively low material cost, an energy source for the heating is needed, resulting in high production cost. Further, the heating needs to be performed under detailed management of a heating temperature and a heating time. If the management is not properly performed, crack control becomes unstable, leading to problems such as the occurrence of variation in electromagnetic wave transmissibility property, and the occurrence of whitish haze in a resulting metallic lustrous member. Further, the heating is performed during the process of forming cracks. This can lead to a new problem that, due to a difference in linear expansion coefficient between the metal layer and the substrate, the laminate undesirably curls, resulting in deteriorated appearance of a resulting metallic lustrous member (see, for example, paragraph [0052] in the Patent Document 4).

The present invention has been made in view of solving the above conventional problems, and an object thereof is to provide: an electromagnetic wave transmissive metal member capable of being easily produced at a low production cost, with both a metallic luster and an electromagnetic wave transmissibility; an article using the electromagnetic wave transmissive metal member; and a production method for an electromagnetic wave transmissive metal film.

Solution to Technical Problem

In order to solve the above problems, according to a first aspect of the present invention, there is provided an electromagnetic wave transmissive metal member comprising a metal layer and a crack layer, wherein the metal layer and the crack layer have, in their respective planes, a plurality of linear cracks extending substantially parallel to each other, and the linear cracks in the metal layer and the linear cracks in the crack layer penetrate through their respective layers in a thickness direction, and are continuous with each other in the thickness direction.

It is noted here that the term "linear" in the above "linear cracks" is added to distinguish them from the gaps or cracks in the conventional techniques, e.g., the island-shaped gaps described in the Patent Document 1, and definitely does not mean being completely linear. The term "linear cracks" encompasses all cracks having linearity at a level obtainable by the method defined in the appended claims, i.e., by "bending and stretching a multi-layered film in a longitudinal direction of the multi-layered film, in a state in which the multi-layered film is folded toward the side of an elongated substrate film along a cross direction intersecting the longitudinal direction". Further, the term "substantially parallel" definitely does not mean being completely parallel, but encompasses any parallel degree enough to be usable in a millimeter-wave radar, a mobile phone, a smart phone, a tablet PC, a notebook PC, a refrigerator and the like as application targets of the present invention.

Preferably, in the electromagnetic wave transmissive metal member according to the first aspect of the present invention, an angle made by adjacent two of the linear cracks included in the plane of at least one of the metal layer and the crack layer is within the range of ±10°.

Preferably, in the electromagnetic wave transmissive metal member according to the first aspect of the present invention, 40% or more of angles, each of the angles being made by a respective one of a plurality of sets of two linear cracks which are arbitrarily selected from among a plurality of linear cracks included in a 400 μm☐(400 μm-square (this will also be applied to the following)) plane of the metal layer or the crack layer are within the range of ±10°.

More preferably, in the above electromagnetic wave transmissive metal member, and as for the two linear cracks which are arbitrarily selected from among a plurality of linear cracks included in a 400 μm square-plane of the metal layer or the crack layer, 40% or more of the angles, each of the angles being made by the selected two linear cracks, are within the range of ±10°, and 40% or more of the angles are in the range of 80° to 100°.

In the electromagnetic wave transmissive metal member according to the first aspect of the present invention, 80% or more of the plurality of linear cracks included in a 400 μm square-plane of the metal layer or the crack layer, lie within the range of ±5° with respect to a reference straight line.

It is noted here that the "reference straight line" means a straight line set in the following manner. In a region between a first straight line having an arbitrarily-set given angle and a second straight line rotated with respect to the first straight line about an arbitrary point as an intersecting point with the first straight line, in a given direction by a given angle, a plurality of straight lines each passing through the arbitrary point are drawn one-by-one every time an angle with respect to the first straight line increases by a unit angle, and a total of lengths of linear cracks overlapping the plurality of straight lines and lines parallel to the plurality of straight lines (except the second straight line and lines parallel to the second straight line) is measured. This measurement is repeatedly performed over all 360° directions about the arbitrary point, in a plurality of the regions each having the given angle, to obtain a plurality of the totals, and a straight line located intermediate between a specific one of a plurality of sets of the first straight line and the second straight line is set as the "reference straight line", wherein the specific set of the first straight line and the second straight line define a region having a largest value among the plurality of totals.

When the rate of the linear cracks lying within the range of ±5° with respect to the reference straight line is relatively large, it means that the linear cracks uniformly extend in a given direction. Thus, it can be considered that a good polarization property is obtained.

In the electromagnetic wave transmissive metal member according to the first aspect of the present invention, the linear cracks may be formed in the metal layer and the crack layer by bending and stretching a multi-layered film obtained by laminating the metal layer and the crack layer on a substrate film, in only one direction in a state in which the multi-layered film is folded toward the side of the substrate film. The term "one direction" here means that the direction of the bending and stretching is along only one direction, and includes a reciprocating feeding processing.

In the electromagnetic wave transmissive metal member according to the first aspect of the present invention, 70% or less of the plurality of linear cracks included in a 400 μm square-plane of the metal layer or the crack layer, lie within the range of ±5° with respect to a reference straight line.

When the rate of the linear cracks overlapping straight lines each having an angle falling within a given range, with respect to the reference straight line, is relatively small, it means that the linear cracks do not uniformly extend in a given direction. Thus, the polarization property deteriorates, whereas the transmissibility becomes better.

In the electromagnetic wave transmissive metal member according to the first aspect of the present invention, the linear cracks may be formed in the metal layer and the crack layer by bending and stretching a multi-layered film obtained by laminating the metal layer and the crack layer on a substrate film, in a plurality of directions in a state in which the multi-layered film is folded toward the side of the substrate film. The term "plurality of directions" here means that the direction of the bending and stretching is along a plurality of directions, and that the multi-layered film may be fed in respective reciprocating directions.

Preferably, in the electromagnetic wave transmissive metal member according to the first aspect of the present invention, each of the linear cracks has a length of 200 μm or more.

Preferably, in the electromagnetic wave transmissive metal member according to the first aspect of the present invention, each of the linear cracks generated in one of the metal layer and the crack layer located farther from a bending side when the metal layer and the crack layer are being bent with a given curvature has a width of 0.1 nm to 100 nm.

Preferably, in the electromagnetic wave transmissive metal member according to the first aspect of the present invention, a ratio of a thickness of the metal layer to a thickness of the crack layer is from 0.1 to 20, the metal layer has a thickness of 10 nm to 1000 nm, and/or the crack layer has a thickness of 5 nm to 5000 nm.

Preferably, in the electromagnetic wave transmissive metal member according to the first aspect of the present invention, the crack layer is made of a substance containing at least one selected from the group consisting of a metal having a Mohs hardness of 4 or more, an alloy comprising a primary component consisting of the metal, and ceramics.

More preferably, in the above electromagnetic wave transmissive metal member, the ceramics contains any of an oxide, a nitride, a carbide and an oxynitride of an element including at least one selected from the group consisting of a metal, silicon, and boron.

Preferably, in the electromagnetic wave transmissive metal member according to the first aspect of the present invention, the metal layer has a Mohs hardness of 1 to less than 4. More preferably, the metal layer contains either of at least one metal selected from the group consisting of Al, Cu, Ag, Au, and Zn, and an alloy comprising a primary component consisting of the metal.

According to a second aspect of the present invention, there is provided an electromagnetic wave transmissive metal film comprising the above electromagnetic wave transmissive metal member and a substrate film, or an electromagnetic wave transmissive metal member-equipped resin component comprising the above electromagnetic wave transmissive metal member and a molded resin substrate.

In order to solve the above problems, according to a third aspect of the present invention, there is provided a method of producing an electromagnetic wave transmissive metal film. The method comprises: forming linear cracks in a metal layer and a crack layer by bending and stretching a multi-layered film in a longitudinal direction of the multi-layered film, in a state in which the multi-layered film is folded toward the side of an elongated substrate film along a cross direction intersecting the longitudinal direction, the multi-layered film being made by laminating the metal layer and the crack layer on the substrate film.

Effect of Invention

The present invention can provide: an electromagnetic wave transmissive metal member capable of being easily produced at a low production cost, with both a metallic luster and an electromagnetic wave transmissibility; an article using the electromagnetic wave transmissive metal member; and a production method for an electromagnetic wave transmissive metal film.

DESCRIPTION OF EMBODIMENTS

With reference to the accompanying drawings, a preferred embodiment of the present invention will now be described. Although only the preferred embodiment of the present invention will be described in the following for the sake of convenience of explanation, it should be understood that the present invention is not limited thereto.

1. Basic Configuration

Figure 1:
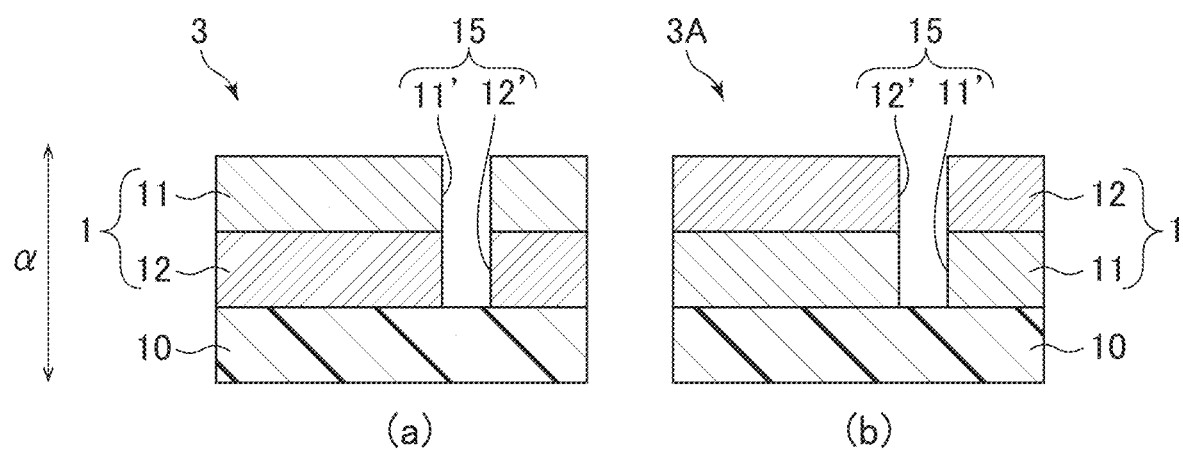
FIG. 1 is a schematic sectional view of a metal film according to one embodiment of the present invention.

FIG. 1 shows schematic sectional views depicting electromagnetic wave transmissive metal members (hereinafter referred to as "metal member" for each) 1 according to one embodiment of the present invention and electromagnetic wave transmissive metal films (hereinafter referred to as "metal film" for each) 3, 3A according to one embodiment of the present invention.

The metal member 1 comprises at least a metal layer 11 and a crack layer 12. Each of the metal films 3, 3A comprises the metal layer 11 and the crack layer 12, and further comprises at least a substrate film 10. The metal film 3 depicted in FIG. 1(a) is configured such that the crack layer 12 and the metal layer 11 are laminated on the substrate film 10 in this order, and the metal film 3A depicted in FIG. 1(b) is configured such that the metal layer 11 and the crack layer 12 are laminated on the substrate film 10 in this order. The metal film 3, 3' set forth in the appended claims includes the both types of metal films depicted in FIGS. 1(a) and 1(b).

In the metal member 1 or the metal film 3 or 3', a linear crack 11' and a linear crack 12' are formed, respectively, in the metal layer 11 and the crack layer 12. The linear crack 11' and the linear crack 12' penetrate through respective ones of the metal layer 11 and the crack layer 12 in a thickness direction (the arrowed direction "a" in FIG. 1) of the metal member 1, wherein the linear crack 11' and the linear crack 12' are continuous with each other in the thickness direction "a", to form a united linear crack 15. Although the metal layer 11, which would hinder transmission (penetration) of electromagnetic waves, is provided, the provision of the above linear crack 15 makes it possible for the metal member 1 to transmit an electromagnetic wave therethrough. The substrate film 10 never hinders transmission of electromagnetic waves, as is clear from the following description.

2. Production of Metal Member and Metal Film

Figure 2:
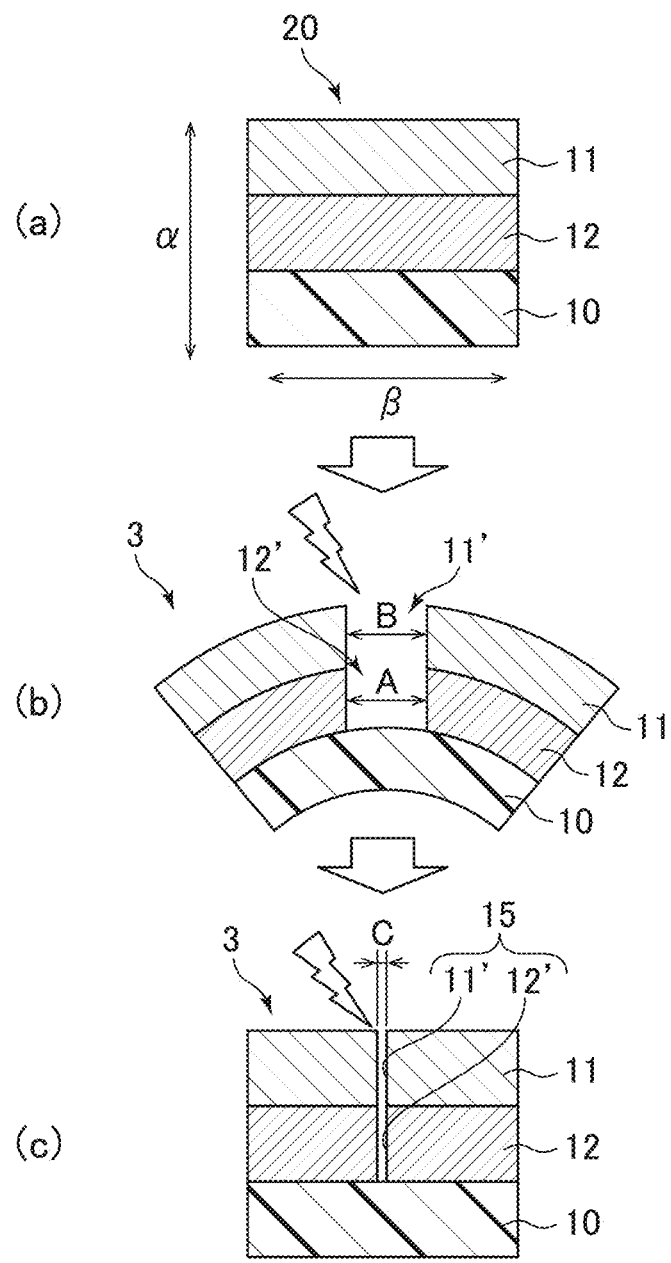
FIG. 2 is a diagram schematically depicting a production process of the metal film.
Figure 3:
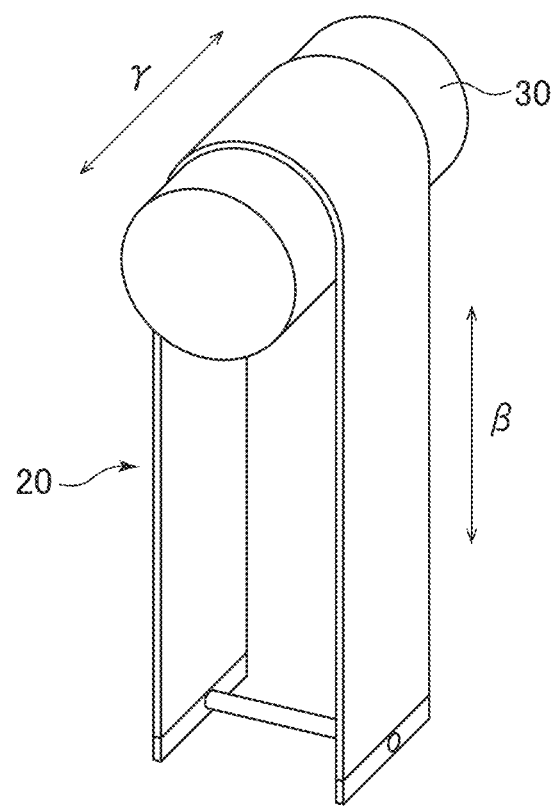
FIG. 3 is a diagram schematically depicting a part of the configuration of an apparatus usable for the production.

With reference to FIGS. 2 and 3, one example of a production method for the metal member 1 and the metal films 3, 3', will be explained below. FIG. 2 is a diagram schematically depicting a process of the production, using sectional views of the same region as that in FIG. 1, and FIG. 3 is a diagram schematically depicting a part of the configuration of an apparatus for the production. In regard to the metal films, the following description will be made based on only the metal film 3 depicted in FIG. 1(a). However, it is to be noted that the metal film 3A depicted in FIG. 1(b) can also be produced in the same manner.

(1) First of all, a multi-layered film 20 is prepared in which a metal layer 11 and a crack layer 12 are laminated on an elongated substrate film 10, as depicted in FIG. 2(a). The crack layer 12 can be formed by vacuum vapor deposition, sputtering, ion plating or the like, and the metal layer 11 can be formed by any of these processes and plating. Among them, sputtering is preferable from a viewpoint of being capable of strictly controlling the thickness of the layer even over a large area. It is preferable that the metal layer 11 and the crack layer 12, or the crack layer 12 and the substrate film 10 are directly joined together without interposing another layer (not depicted) therebetween. However, they do not necessarily have to be directly joined together, but only need to be laminated in a manner allowing the aforementioned linear crack 15 to be formed.

(2) Subsequently, the multi-layered film 20 is bent and stretched using the apparatus depicted in FIG. 3. This apparatus primarily comprises a columnar (or cylindrical) member 30. The columnar member 30 may be, e.g., a drum or a rod, and a material thereof may be any of wood, plastic and a metal. However, considering that a relatively large tension needs to be applied to the multi-layered film 20 during the bending and stretching, it is preferable to use a metal material having higher rigidity than those of the remaining materials. The columnar member 30 is installed along a cross direction "γ" intersecting a longitudinal direction (the arrowed direction "β" in FIG. 3) of the multi-layered film 20. An angle made by the longitudinal direction "β" and the cross direction "γ" is preferably set to 90°. Here, an error margin with respect to 90° is preferably set to be within the range of ±5°. This is because the linear cracks 11', 12' can be efficiently generated as long as the angle falls within this range. The multi-layered film 20 is fed plural times along the longitudinal direction "β" while applying a tension thereto, in a state in which it has a curved surface having a given curvature, along an outer peripheral surface of the columnar member 30, i.e., in a state in which it is folded and bent toward the side of the substrate film 10 by using the columnar member 30. The tension to be applied to the multi-layered film 20 is preferably set in the range of 30 N to 200 N. By setting the tension in the above range, it becomes possible to maintain a force for inducing the linear crack 11' in the metal layer 11, while preventing breaking of the substrate film 10. Further, a movement speed (feeding speed) of the multi-layered film 20 is preferably set to 1 cm/sec or more. By setting the movement speed to the above value, it becomes possible to efficiently generate the linear cracks 11', 12'.

As depicted in FIG. 2(b), the bending and stretching processing can generate a linear crack 12' having a width "A" along the cross direction "γ", on a side closer to a bending side, or in the crack layer 12 in the example of the metal film 3 depicted in FIG. 2, so that the linear crack 12' penetrates through the crack layer 12. On the other hand, the bending and stretching processing can induce a linear crack 11' having a width "B" along the cross direction "γ" by a stress arising in the metal layer 11 during generation of the linear crack 12' in the crack layer 12, on a side farther from the bending side, or in the metal layer 11, so that the linear crack 11' penetrates through the metal layer 11. The linear crack 12' and the linear crack 11' are continuous with each other in a thickness direction "a" of the metal film 3, so that it becomes possible to allow an electromagnetic wave to be transmitted through the metal film 3 despite the presence of the metal layer 11. Here, a difference between the widths "A", "B" of the linear cracks 12', 11' is significantly small, i.e., an ignorable level from the perspective of an electromagnetic wave transmissibility. Further, each of the widths "A", "B" is about 100 nm at most, and it has no influence on an external appearance of the metal film 3.

(3) Although the metal film 3 can be used in the state depicted in FIG. 2(b), the metal layer 11 and the crack layer 12 may be restored to a flat shape. In the resulting flat shape, the linear crack 15 has a width "C" slightly less than the width "A" or "B" in the bent state. However, even in the flat shape, the linear crack 15 still penetrates through the metal layer 11 and the crack layer 12, and is kept in thicknesswise continuous state, and will never be fully closed up after once it is generated. Thus, even if the metal film 3 is used in the state depicted in FIG. 2(c), there is no serious negative influence on electromagnetic wave transmissibility.

The electromagnetic wave transmissibility of the metal film can be finely adjusted by the widths "A" to "C" of the linear cracks, or a pitch between adjacent two linear cracks (as well depicted in FIG. 4 described later). Such widths or a pitch can be easily adjusted by adjusting the curvature of the columnar member 30. For example, by using a columnar member having a larger curvature than that of the columnar member 30 depicted in FIG. 3, it is possible to set each of the widths "A" to "C" to a larger value, and set the pitch between adjacent two linear cracks to a smaller value. Further, the direction of the linear crack can be easily adjusted by adjusting an angle made by a direction along which the tension is applied, i.e., the longitudinal direction p, and the cross direction "γ".

The metal member 1 can be obtained by transferring a metal member 1 formed during production of the metal film 3. Further, this metal member 1 may be transferred to a resin substrate (not depicted) to produce an electromagnetic wave transmissive metal member-equipped resin component comprising the metal member 1 and the resin substrate.

3. Substrate Film

As the substrate film 10, it is possible to use a transparent film made of a homopolymer or copolymer of polyethylene terephthalate (PET), polyethylene naphthalate (PEN), polybutylene terephthalate, polyamide, polyvinyl chloride, polycarbonate (PC), cycloolefin polymer (COP), polystyrene, polypropylene (PP), polyethylene, polycycloolefin, polyurethane, polymethylmethacrylate (PMMA), or ABS. Such a transparent film is suited to the bending and stretching under tension, and has no influence on metallic luster and electromagnetic wave transmissibility. However, from a viewpoint of forming the metal layer 11 and the crack layer 12 thereon, the transparent film is capable of withstanding high temperatures during vapor deposition, sputtering or the like. Thus, among the above materials, e.g., polyethylene terephthalate, polyethylene naphthalate, polymethylmethacrylate, polycarbonate, cycloolefin polymer, ABS, polypropylene, and polyurethane are preferable. Among them, polyethylene terephthalate is particularly preferable, because it has a good balance between heat resistance and cost.

The substrate film 10 may be a single-layer film or may be a laminate film. The thickness thereof is preferably in the range of about 6 to 250 μm. With a view to enhancing adhesion with the metal layer 11 or the crack layer 12, it may be subjected to plasma processing.

4. Crack Layer

The crack layer 12 is intended to induce, in the metal layer 11 which is continuous with the linear crack 12', the linear crack 11' during generation of the linear crack 12', by means of a stress arising in the metal layer 11 disposed in contact with or adjacent to the crack layer 12. Thus, the crack layer 12 needs to be easy to enable the linear crack 12' to be generated therein and to be capable of applying a sufficient stress to the metal layer 11.

For this reason, the thickness of the crack layer 12 is typically in the range of 5 nm to 5000 nm, preferably in the range of 10 to 1000 nm, more preferably in the range of 20 to 200 nm.

It is considered that a substance having a given hardness is breakable due to its relatively low breaking strength, as long as it has a moderately thin thickness. Thus, examples of a material suitable for the crack layer 12 include: a metal having a Mohs hardness of 4 or more, such as a metal including at least one selected from the group consisting of Cr, Ti, W, V, Nb, Mo, and Ni; and an alloy comprising a primary component consisting of the metal. For the same reason, a ceramics having an extremely high brittleness can be deemed as a material suitable for the crack layer 12. The ceramics may contain any of an oxide, a nitride, a carbide and an oxynitride of an element including at least one selected from the group consisting of a metal, silicon, and boron. Examples of the oxide here include $AL_2O_3$, ITO (tin-doped indium oxide), ZnO, $TiO_2$, $Nb_2O_5$ and $SiO_2$. Examples of the nitride include AlN, TiN, SiN and BN, and examples of the carbide include TiC and SiC. Here, ITO is a substance containing costly In. However, it is a mixture of In and other substances, and thereby a production cost thereof can be reduced as comparted to a case of using only In.

Mohs hardnesses of main metals are presented in the following Table 1.

TABLE 1

| Element | Mohs Hardness |
|---------|---------------|
| In | 1.2 |
| Sn | 1.5 |
| Pb | 1.5 |
| Au | 2.5 |
| Ag | 2.5 |
| Mg | 2.5 |
| Zn | 2.5 |
| Al | 2.75 |
| Cu | 3 |
| Fe | 4 |
| Ni | 4 |
| Mo | 5.5 |
| Ti | 6 |
| Nb | 6 |
| V | 6.7 |
| W | 7.5 |
| Cr | 8.5 |

5. Metal Layer

The metal layer 11 needs to be capable of enabling the linear crack 11' to be induced and generated therein by the linear crack 12', as well as being capable of exhibiting a sufficient metallic luster. On the other hand, when the linear crack is generated therein, it needs to have a width enough to avoid spoiling the external appearance due to scattering or whitish haze. Thus, the metal layer 11 preferably has a hardness less than that of the metal contained in the crack later.

For this reason, a metal having a Mohs hardness of 1 to less than 4 is suitable as the metal layer 11. As one example, the metal layer 11 preferably contains either of at least one metal selected from the group consisting of Al, Cu, Ag, Au, and Zn, and an alloy comprising a primary component consisting of the metal. Particularly, from a viewpoint of stability and cost of a substance, Al, Cu and an alloy thereof is preferable.

In view of enabling the linear crack 11' to be easily induced, the thickness of the metal layer 11 is typically in the range of 10 nm to 1000 nm, preferably in the range of 20 to 200 nm, more preferably in the range of 30 to 100 nm. This thickness is suited to forming a uniform film, and can provide a good appearance to a molded resin article as a final product. Further, considering the thickness and brittleness of each of the metal layer 11 and the crack layer 12, a ratio of the thickness of the metal layer to the thickness of the crack layer, i.e., the thickness of the metal layer/the thickness of the crack layer, is preferably in the range of 0.1 to 20, more preferably, in the range of 0.2 to 10. Further, for the same reason, the Mohs hardness of the metal layer 11 is preferably less than the Mohs hardness of the crack layer 12, and typically in the range of 1 to less than 4, preferably in the range of 2 to 3.5.

6. Linear Crack

Figure 4:
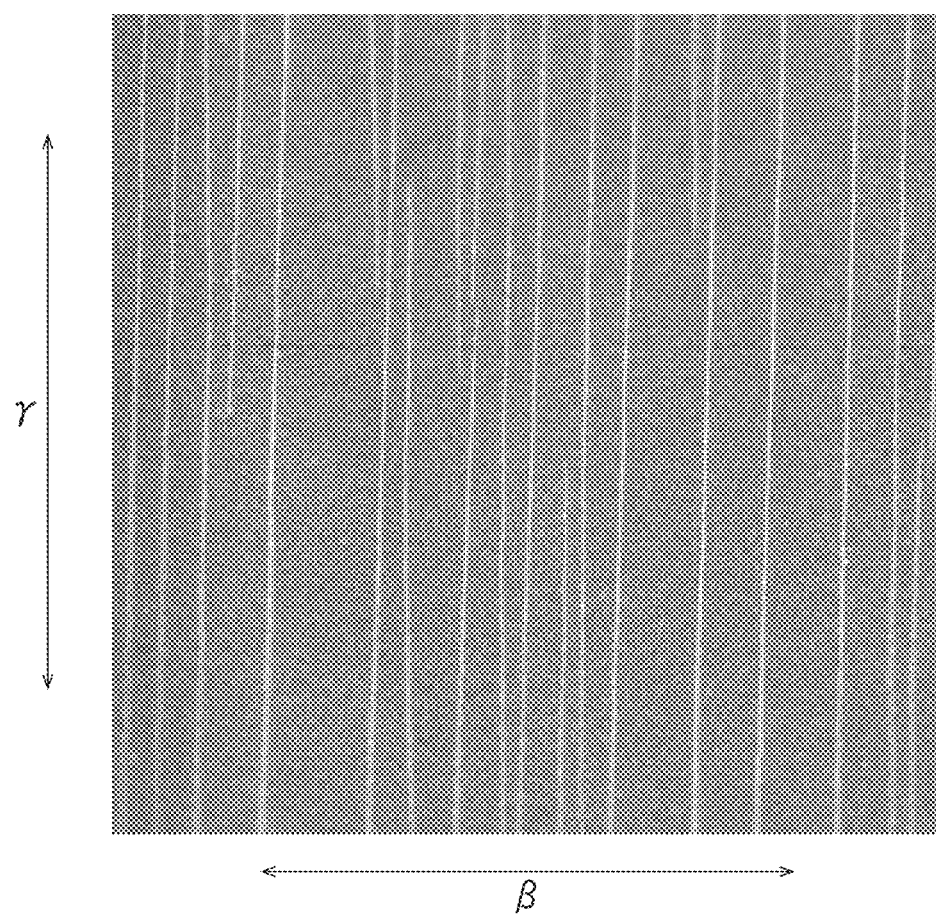
FIG. 4 is an optical microscopic image of linear cracks generated in the metal film.

FIG. 4 shows an optical microscopic image of linear cracks generated in the metal film 3. Although this figure is an image corresponding to the metal film 3 depicted in FIG. 1(*a*), it may be considered that the same image can also be obtained in the metal film 3A depicted in FIG. 1(*b*). Further, this image is taken in a state in which the metal film 3 is wound around a metal rod (this state is equivalent to that in FIG. 2(*b*)). Thus, the width of the linear crack 11' (which is equivalent to the width "B" in FIG. 2(*b*)) is emphasized by being slightly larger than the width of the linear crack (which is equivalent to the width "C" in FIG. 2(*c*)) in a state in which the metal layer 11 and the crack layer 12 are restored to a flat shape (this state is equivalent to that in FIG. 2(*c*)). Further, in fact, FIG. 4 shows only the linear cracks 11' of the metal layer. However, since any two corresponding ones of the linear cracks 11' and the linear cracks 12' are continuous with each other in the thickness direction, it may be considered that FIG. 4 shows both the linear cracks 11' of the metal layer and the linear cracks 12' of the crack layer 12.

As is clear from FIG. 4, the metal layer 11 or the crack layer 12 has a plurality of linear cracks (each of which is equivalent to the linear crack (11', 12', 15) in FIGS. 2(*b*) and 2(*c*)) extending substantially parallel to each other in a plane of a corresponding one of the metal and crack layers. For example, an electromagnetic wave to be emitted and received using a millimeter-wave radar, has directionality, and thus the above linear cracks can be considered to be suitable for use in a device such as a millimeter-wave radar. The term "substantially parallel" here definitely encompasses being not perfectly parallel but being parallel enough to ensure applicability of the metal film to an electromagnetic wave having directionality.

The linear cracks may be formed not only in one direction but also in a plurality of directions. For example, the multi-layered film is subjected to bending and stretching in the longitudinal direction "β" of the multi-layered film to form the linear cracks depicted in FIG. 4. Then, after turning the multi-layered film by 90°, the multi-layered film is further subjected to bending and stretching in the cross direction "γ" orthogonal to the longitudinal direction "β" to obtain a metal film having a lattice pattern in which two groups of linear cracks cross each other. In this case, it is possible to obtain an electromagnetic wave transmissive metal member having an enhanced electromagnetic wave transmissibility in all directions, irrespective of directionality of an electromagnetic wave.

Even though the linear cracks 11', 12', 15 are small in size, they can significantly increase a sheet resistance. As the sheet resistance becomes larger, an electromagnetic wave transmissivity attenuation rate becomes smaller, which provides a sufficient electromagnetic wave transmissibility to the metal film 3, 3'. The sheet resistance of the metal film 3, 3' is typically equal to or greater than 100Ω/□, preferably equal to or greater than 200Ω/□, more preferably equal to or greater than 400Ω/□. Further, the electromagnetic wave transmissivity attenuation rate of the metal film 3, 3' in this embodiment is typically equal to or less than −10 dB, preferably equal to or less than −5 dB, more preferably equal to or less than −1 dB.

The width of each of the linear cracks in the metal film 3, 3' during the bending, more exactly, the width of each of the linear cracks 11' (12') in a layer located farther from the bending side, or in the metal layer 11 in the example of FIG. 4, is typically in the range of 0.1 nm to 100 nm, preferably in the range of 0.2 nm to 60 nm, more preferably in the range of 0.3 nm to 30 nm, in a state in which the metal film 3 is wound around a metal rod having a diameter of 6 mm, while being folded toward the side of the substrate film. The width of each of the linear cracks 11' (12') during the bending is emphasized by being slightly larger than the width of each of the linear cracks 15 in the state in which the metal layer 11 is restored to the flat shape. Thus, at any rate, the width of each of the linear cracks becomes equal to or less than the above value.

Further, an angle, in the metal film 3, 3', made by adjacent two of the linear cracks 11', 12', 15 included in the plane, is typically within the range of ±10°, preferably within the range of ±5°. This angular difference can be considered to mean that the linear cracks are substantially parallel to each other, in regard to, e.g., a millimeter-wave radar.

In a case where the linear cracks are formed in an approximately rectangular lattice pattern, 40% or more of angles, each of the angles being made by two linear cracks which are arbitrarily selected from among a plurality of linear cracks 11', 12', 15 included in an arbitrary 400 μm□ (square)-plane of the metal or crack layer, are typically within the range of ±10°, preferably within the range of ±5°, more preferably within the range of ±2°. Further, in a case where the linear cracks are formed in an approximately rectangular lattice pattern, 40% or more of the angles, each of the angles being made by two linear cracks which are arbitrarily selected from among a plurality of linear cracks 11', 12', 15 included in a 400 μm□-plane of the metal or crack layer, are typically within the range of ±10° (preferably within the range of ±5°, more preferably within the range of ±2°), and 40% or more of the angles are typically in the range of 80° (preferably 85° or less than 85°, more preferably 87° or more than 87°) to 100° (preferably 105° or less than 105°, more preferably 102° or less than 102°). Performance can be improved by suppressing an angular variation in the linear cracks as described above.

The length of each of the linear cracks 11', 12', 15' in the metal film 3, 3' is typically equal to or greater than 200 μm, preferably equal to or greater than 500 μm. For example, the wavelength of a signal to be emitted and received by a millimeter-wave radar is about 4 mm Thus, the above length is considered to be sufficient for use in a millimeter-wave radar.

7. Inventive Examples 1 to 4, and Comparative Examples 1 to 8

The present invention will be more specifically described below by taking inventive examples and comparative examples. Various samples of the metal film were prepared, and evaluated in terms of visible light reflectance, surface resistance and microwave electric field transmission attenuation amount. The visible light reflectance is used for evaluation on metallic luster, and the surface resistance and the microwave electric field transmission attenuation amount are used for evaluation on electromagnetic wave transmissibility. A larger value of each of the visible light reflectance and the surface resistance is more desirable, and a smaller value of the microwave electric field transmission attenuation amount is more desirable.

Details of evaluation methods are as follows.

(1) Visible Light Reflectance

A reflectance at a measurement wavelength of 550 nm was measured using a spectrophotometer U4100 manufactured by Hitachi High Technologies Co., Ltd. As a reference value, the reflectance of an Al-deposited mirror was defined as a reflectance of 100%.

In order to have a sufficient metallic luster, the visible light reflectance need to be equal to or greater than 40%, preferably equal to or greater than 60%, more preferably equal to or greater than 70%. If the visible light reflectance is equal to or less than 40%, there is a problem that metallic luster significantly deteriorates, resulting in poor external appearance.

(2) Surface Resistance

The surface resistance was measured by an eddy-current measurement method in accordance with JIS-Z2316, using a non-contact type resistance measuring device NC-80MAP manufactured by Napson Corporation.

For example, the surface resistance needs to be equal to or greater than 100/□, preferably equal to or greater than 200Ω/□, more preferably equal to or greater than 400Ω/□. If the surface resistance is equal to or less than 100Ω/□, there is a problem that a sufficient electromagnetic wave transmissibility cannot be obtained.

(3) Microwave Electric Field Transmission Attenuation Amount

A microwave electric field transmission attenuation amount at 1 GHz was evaluated using a KEC method measurement and evaluation jig, and a spectral analyzer CXA signal Analyzer NA9000A manufactured by Agilent technologies Inc.

The microwave electric field transmission attenuation amount needs to be equal to or less than −10 dB, preferably, equal to or less than −5 dB, more preferably equal to or less than −1 dB. If the microwave electric field transmission attenuation amount is equal to or greater than −10 dB, there is a problem that 90% or more of an electromagnetic wave is shielded.

An electromagnetic wave transmissibility in a frequency band (76 to 80 GHz) of a millimeter-wave radar is correlated with an electromagnetic wave transmissibility in a microwave band (1 GHz), which exhibits a relatively low value. Thus, in this evaluation, the electromagnetic wave transmissibility in the microwave band (1 GHz) was used as an indicator.

A result of the evaluations is presented in the following Table 2. In the Table 2, the "upper" layer indicated in the field "Layer Configuration" means a layer located farther from the bending side (the side of the substrate film 10), while the "lower" layer means a layer located closer to the bending side. Further, in a case where only one of the metal and crack layers is provided, the presence and the absence of the metal or crack layer are denoted, respectively, by "yes" and "-" in the field "Layer Configuration". In Inventive Example 1 and Comparative Example 1, no value is indicated in the field "Mohs Hardness". This is simply because it was difficult to measure an accurate value of the Mohs hardness, but does not mean the Mohs hardness is small. A material for the crack layer has a Mohs hardness of at least 4 or more which is sufficiently greater than the Mohs hardness of a material for the metal layer.

Figure 5:
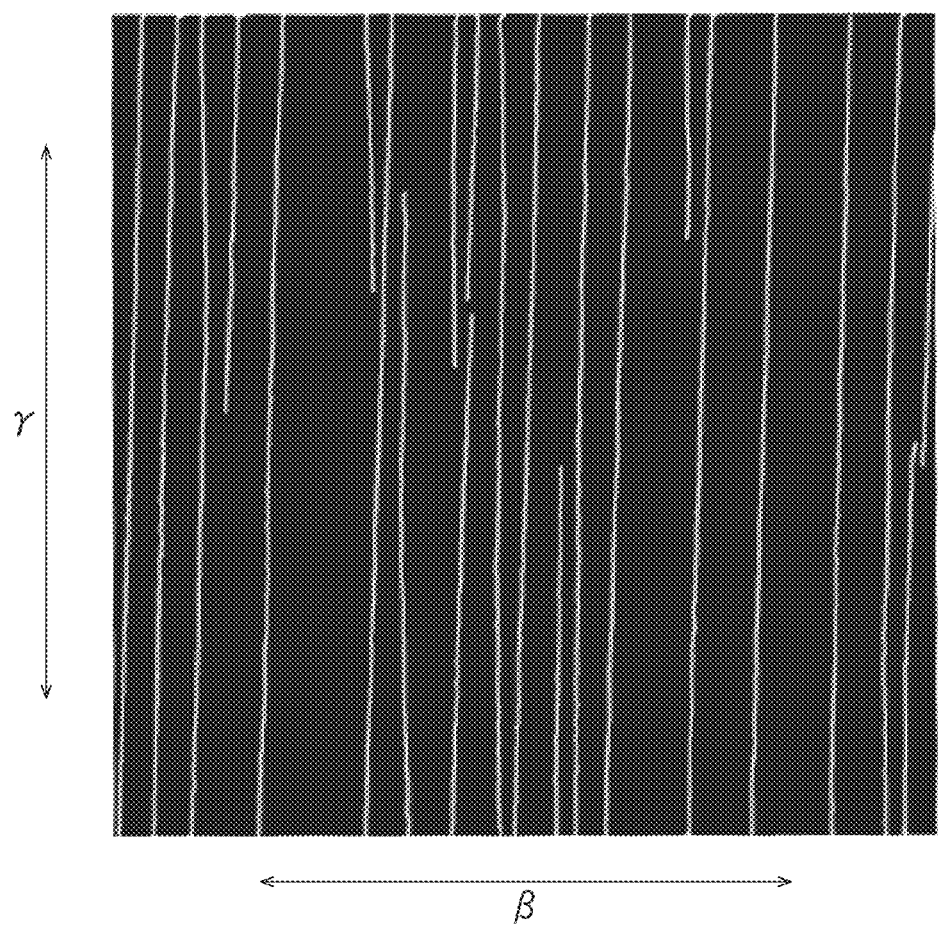
FIG. 5 is an image obtained by subjecting an image of the same region as that in FIG. 4 to binarization processing.
Figure 6:
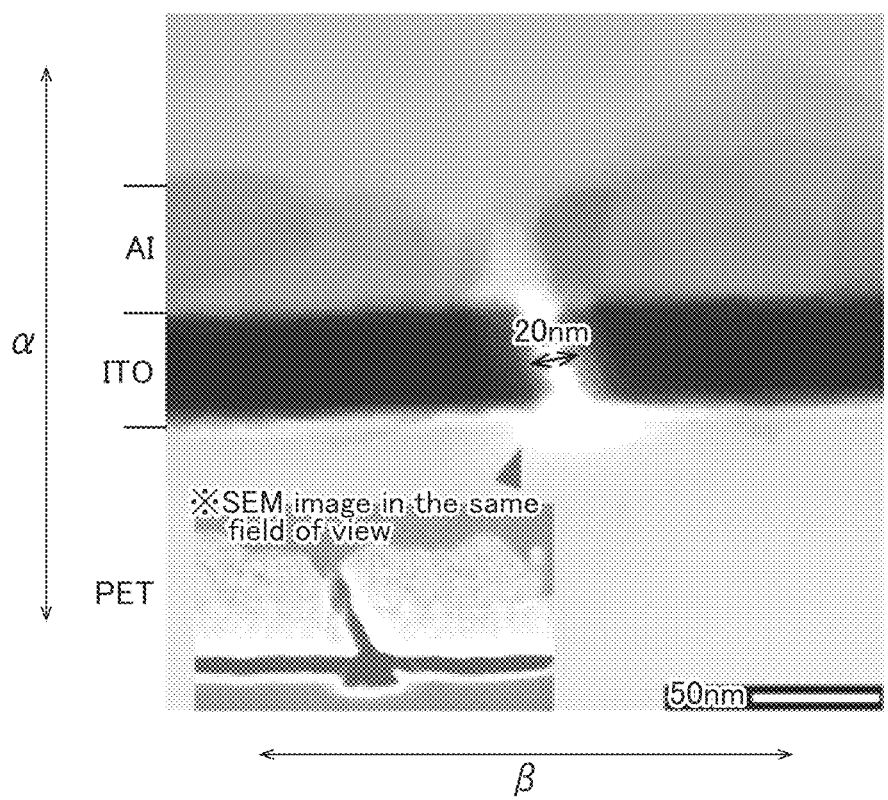
FIG. 6 is a magnified image of a cross-section of the metal film.

Further, FIG. 6 shows an image of a cross-section of the metal film magnified by a transmission electron microscope (TEM), together with an SEM image. The images in FIGS. 4 to 6 were taken in the state in which the metal film was wound around the 6 mm-diameter metal rod. Thus, the linear cracks are exactly emphasized as compared to a state in

TABLE 2

| | Metal Layer | | | | Crack Layer | | | | | Visible | | microwave electric field |
|---|---|---|---|---|---|---|---|---|---|---|---|---|
| | Layer Config-uration | Material | Mohs Hardness | Thick-ness (nm) | Layer Structure | Material | Mohs Hardness | Thick-ness (nm) | Crack Forming Processing | Light Reflectance (%) | Surface Resistance (Ω/□) | attenuation amount (@1 GHz) |
| Inventive Example 1 | upper | Al | 2.5 | 70 | lower | ITO | — | 50 | Bending | 80.4 | 181 | −6.8 |
| Inventive Example 2 | upper | Al | 2.5 | 50 | lower | $Al_2O_3$ | 9 | 50 | Bending | 77.2 | 250 | −2.7 |
| Inventive Example 3 | lower | Al | 2.5 | 20 | upper | Cr | 8.5 | 45 | Bending | 53 | >1200 | −0.5 |
| Inventive Example 4 | upper | Al | 2.5 | 70 | lower | ITO | — | 50 | Bending (biaxial) | 79.3 | 208 | −4.4 |
| Comparative Example 1 | upper | Al | 2.5 | 70 | lower | ITO | — | 50 | — | 78.5 | 1.0 | −42.8 |
| Comparative Example 2 | upper | Al | 2.5 | 70 | lower | $Al_2O_3$ | 9 | 50 | — | 76.7 | 1.3 | −40.1 |
| Comparative Example 3 | lower | Al | 2.5 | 20 | upper | Cr | 8.5 | 45 | — | 52.9 | 5.5 | −29.5 |
| Comparative Example 4 | lower | Al | 2.5 | 20 | upper | Cr | 8.5 | 45 | Heating | 50.5 | 18.8 | −16.0 |
| Comparative Example 5 | yes | Al | 2.5 | 70 | — | — | — | — | — | 73.7 | 1.4 | −40.0 |
| Comparative Example 6 | yes | Al | 2.5 | 70 | — | — | — | — | Bending | 73.9 | 1.6 | −38.4 |
| Comparative Example 7 | — | — | — | — | yes | Cr | 8.5 | 50 | — | 37.7 | 43.2 | −17.1 |
| Comparative Example 8 | — | — | — | — | yes | Cr | 8.5 | 50 | Bending | 38.8 | >1200 | −0.7 |

Inventive Example 1

This is an example in which the metal layer and the crack layer are arranged, respectively, as an upper layer and a lower layer. A PET film (thickness: 125 μm) manufactured by Mitsubishi Plastics, Inc. was used as a substrate film (which is equivalent to the substrate film 10 in FIGS. 1 and 2). A 50 nm-thick ITO layer was formed on the substrate film by a sputtering process, and then a 70 nm-thick aluminum (Al) layer was formed on the ITO layer by a sputtering process to obtain a multi-layered film. Here, ITO is a complex oxide in which $SnO_2$ is contained in $In_2O_3$ in an amount of 10 wt %.

Subsequently, this multi-layered film was wound around a metal rod having a diameter of 6 mm while being folded toward the side of the substrate film, as previously described with reference to FIG. 3, and moved by a force of 100 N, at a feed speed of 10 cm/sec, to produce a metal film. The bending and stretching processing was performed by feeing the multi-layered film in the longitudinal direction "β" in a reciprocating manner. This processing was repeated 12 times.

FIG. 4 shows an optical microscopic image of a surface of the metal film obtained by the above bending and stretching processing, and FIG. 5 shows an image obtained by subjecting an image of the same region as that in FIG. 4 to binarization processing. The size of the image in FIG. 5 is 400 μm□. Linear cracks included in this region (each of the linear cracks is equivalent to the linear crack 15 in FIG. 2(c)) were analyzed in terms of number, interval and length.

which the multi-layered film is not wound. However, the image region having a micron order size is externally smaller that the diameter of the metal rod having a nanometer order size, and therefore it may be considered that substantially the same images as those in FIGS. 4 to 6 can be obtained even in the state in which the multi-layered film is not wound.

FIGS. 4 and 5 show that a plurality of linear cracks are generated in a plane of the metal film. Further, FIG. 6 shows that the linear crack of the upper layer (Al layer) and the linear crack of the lower layer (ITO layer) penetrate through respective ones of the upper layer and the lower layer in a thickness direction of the metal film, wherein the two linear cracks are continuous with each other in the thickness direction to form a united linear crack.

In FIG. 5, twenty-three linear cracks are includes in a plane per unit area. As a result of an additional analysis about the twenty-three linear cracks, an interval between adjacent two of the linear cracks was 11 μm on average. Further, on the assumption that a vertical direction in FIG. 5 is defined as 0°, a variation in parallelism with each of the linear cracks included in the plane was measured. As a result, the variation falls within the range of −3.4° to +1.4°. Further, 50% or more of the angles, each of the angles being made by two linear cracks which are arbitrarily selected from among the linear cracks included in the plane, are within the range of ±0.5°, and 90% or more of the angles are within the range of ±2.0°. Further, after forming the linear cracks presented in FIG. 5, the metal film was further subjected to bending and stretching in a direction orthogonal to the longitudinal direction "β" to obtain a metal film having a lattice pattern in which two groups of linear cracks cross with each other. In the obtained metal film, 50% or more of the angles made by a plurality of linear cracks which are included in a plane per unit area, are within the range of ±0.5°, and 40% or more of the angles are in the range of 0.5° to 1°.

In Inventive Example 1, a good result was obtained with regard to all of the visible light reflectance, the surface resistance, and the microwave electric field transmission attenuation amount. In other words, a metal film or a metal member having both a metallic luster and an electromagnetic wave transmissibility could be obtained.

Inventive Example 2

This is an example in which the metal layer and the crack layer are arranged, respectively, as an upper layer and a lower layer, as with Inventive Example 1, except that the crack layer is made of alumina ($Al_2O_3$). The remaining conditions are the same as those in Inventive Example 1. For reference, the Mohs hardness of alumina is 9, whereas the Mohs hardness of aluminum (Al) used as a material for the metal layer is 2.5.

In this case, a metal film or a metal member having both a metallic luster and an electromagnetic wave transmissibility could be obtained.

Inventive Example 3

This is an example in which the crack layer and the metal layer are arranged, respectively, as an upper layer and a lower layer, differently from Inventive Examples 1 and 2. Further, differently from Inventive Example 1, the crack layer was formed as a 45 nm-thick chromium (Cr) layer, and the metal layer was formed as a 20 nm-thick aluminum (Al) layer. The remaining conditions are the same as those in Inventive Example 1. For reference, the Mohs hardness of chromium is 8.5, whereas the Mohs hardness of aluminum is 2.5.

In this case, a metal film or a metal member having both a metallic luster and an electromagnetic wave transmissibility could be obtained.

Inventive Example 4

Differently from Inventive Example 1, the multi-layered film was subjected to the bending and stretching processing in a plurality of directions, more specifically, subjected to the bending and stretching processing in the longitudinal direction "β" (see FIG. 3) and then subjected to the bending and stretching processing in the cross direction "γ" orthogonal to the longitudinal direction "β", to obtain a metal member in which two groups of linear cracks cross with each other.

In this case, a metal film or a metal member having both a metallic luster and an electromagnetic wave transmissibility could be obtained.

Comparative Example 1

This is an example in which the metal layer and the crack layer are arranged, respectively, as an upper layer and a lower layer, as with Inventive Example 1. However, differently from Inventive Example 1, the bending and stretching processing was not performed. The remaining conditions are the same as those in Inventive Example 1.

In this case, a result regarding the electromagnetic wave transmissibility was insufficient, although a good result could be obtained with regard to the metallic luster.

Comparative Example 2

This is an example in which the metal layer and the crack layer are arranged, respectively, as an upper layer and a lower layer, as with Inventive Example 1. The thickness of an aluminum (Al) layer as the upper layer was set to 70 nm, and an alumina ($Al_2O_3$) layer was used as the crack layer. Differently from Inventive Example 1, the bending and stretching processing was not performed. The remaining conditions are the same as those in Inventive Example 1.

In this case, a result regarding the electromagnetic wave transmissibility was insufficient, although a good result could be obtained with regard to the metallic luster.

Comparative Example 3

This is an example in which the crack layer and the metal layer are arranged, respectively, as an upper layer and a lower layer, differently from Inventive Example 1. Further, differently from Inventive Example 1, the bending and stretching processing was not performed, and a 45 nm-thick chromium layer and a 20 nm-thick aluminum layer were used, respectively, as the crack layer and the metal layer. The remaining conditions are the same as those in Inventive Example 1.

In this case, a result regarding the electromagnetic wave transmissibility was insufficient, although a good result could be obtained with regard to the metallic luster.

Comparative Example 4

This is an example in which the crack layer and the metal layer are arranged, respectively, as an upper layer and a lower layer, differently from Inventive Example 1. Further, differently from Inventive Example 1, a 45 nm-thick chromium layer and a 20 nm-thick aluminum layer were used, respectively, as the crack layer and the metal layer. Further, heating processing was performed, instead of performing the bending and stretching processing. The heating is based on operation of placing the metal film in an environment having a temperature of 120 degrees for 2 hours. The remaining conditions are the same as those in Inventive Example 1.

In this case, a result regarding the electromagnetic wave transmissibility was insufficient, although a good result could be obtained with regard to the metallic luster. Moreover, the metal film undesirably curled after the heating processing, resulting in difficulty in putting it to practical use.

Comparative Examples 5 and 6

These are examples in which only the metal layer is used, differently from Inventive Example 1. Further, the bending and stretching processing was not performed in Comparative Example 5, although it was performed in Comparative Example 6, as with Inventive Example 1. The remaining conditions are the same as those in Inventive Example 1.

In this case, a result regarding the electromagnetic wave transmissibility was insufficient, although a good result could be obtained with regard to the metallic luster.

Comparative Examples 7 and 8

These are examples in which only the crack layer is used, differently from Inventive Example 1. Further, differently from Inventive Example 1, a 50 nm-thick chromium layer was used as the crack layer. Further, the bending and stretching processing was not performed in Comparative Example 7, although it was performed in Comparative Example 8, as with Inventive Example 1. The remaining conditions are the same as those in Inventive Example 1.

In this case, a result regarding the metallic luster was insufficient because whitish haze occurred in an external surface, causing significant deterioration in the visible light reflectance, although a good result could be obtained with regard to the electromagnetic wave transmissibility was insufficient.

8. Inventive Examples 5 to 9, and Comparative Example 9

Various metal films were evaluated in terms of visible light reflectance, radio wave transmission attenuation amount, polarization degree, and crack ratio. The "visible light reflectance" is the same as the "visible light reflectance" in the aforementioned Inventive Example 1, etc., and the "radio wave transmission attenuation amount" is substantially equivalent to the "microwave electric field transmission attenuation amount" in the aforementioned Inventive Example 1, etc., and used for evaluation on electromagnetic wave transmissibility. The "polarization degree" is used for evaluation on polarization property obtained when linear cracks uniformly extend in a given direction. A larger value of the polarization degree means higher directionality of an electromagnetic wave. From a viewpoint of this directionality, a larger value of the polarization degree is more desirable. The "crack ratio" is correlated with the polarization degree. Thus, this was also added to evaluation items.

Details of evaluation methods are as follows.
(1) Visible Light Reflectance This item was measured by the same method using the same device as those in the aforementioned Inventive Example 1, etc.
(2) Radio Wave Transmission Attenuation Amount (Transmissivity)

A radio wave transmission attenuation amount at 76.5 GHz was evaluated using a transmission-reflection (return) attenuation measurement system LAF-26.5A manufactured by Keycom Corporation. The radio wave transmission attenuation amount is equivalent to the "microwave electric field transmission attenuation amount" in the aforementioned Inventive Example 1, etc. However, in this evaluation, microwave electric field transmission attenuation amounts of a "transmission axis" and a "blocking axis" were determined individually. The "microwave electric field transmission attenuation amount" in the aforementioned Inventive Example 1, etc., is substantially equivalent to the microwave electric field transmission attenuation amount of the "transmission axis". The radio wave transmission attenuation amount of the "transmission axis" here means a radio wave transmission attenuation amount to be obtained when, in the above measurement system, a "polarization direction" of an electric field component of a receiving/emitting antenna is disposed to become perpendicular to a direction of a "linear crack serving as a reference line". On the other hand, the radio wave transmission attenuation amount of the "blocking axis" here means a radio wave transmission attenuation amount to be obtained when, in the above measurement system, the "polarization direction" is disposed to become parallel to the direction of the "linear crack serving as a reference line". In a case where the "polarization direction (polarization plane)" has an elliptical shape, a long axis thereof is used as the polarization direction. The "linear crack serving as a reference line" is defined as a linear crack along a "reference straight line" in "(4) Crack Ratio" as described later. The radio wave transmission attenuation amount of the "transmission axis" needs to be equal to or less than −10 dB, preferably equal to or less than −5 dB, more preferably equal to or less than −1 dB, as with the microwave electric field transmission attenuation amount" in the aforementioned Inventive Example 1, etc.

The "transmissivity" is a value which is not used for calculating the radio wave transmission attenuation amount but necessary for determining "(3). Polarization Degree" as described below, and can be determined by the following formula, using a value of the radio wave transmission attenuation amount.

Transmissivity (%)=10^(−X/10)×100 (where X denotes the radio wave transmission attenuation amount (dB))

(3) Polarization Degree

The polarization degree is a value calculated as a ratio of the transmissivity (%) regarding the radio wave transmission attenuation amount of the "transmission axis" (hereinafter referred to as "T1") to the transmissivity (%) regarding the radio wave transmission attenuation amount of the "blocking axis" (hereinafter referred to as "T2"), i.e., T1/T2. The polarization degree is appropriately adjusted according to the intended use. Generally, the polarization degree is preferably equal to or more than 1000, more preferably equal to or more than 2000, further preferably equal to or more than 4000.

(4) Crack Ratio

Figure 7:
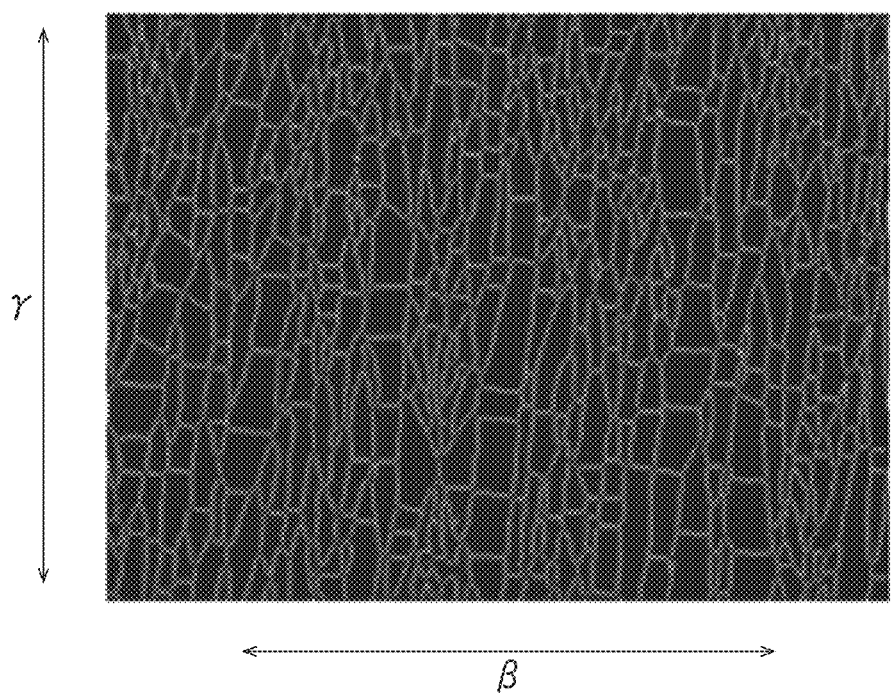
FIG. 7 is a binarized image of a metal film according to another embodiment of the present invention.

With reference to FIG. 7, a calculation method for the crack ratio will be described. This figure is an image corresponding to FIG. 5, wherein the image is obtained by subjecting an optical microscopic image of a surface of a metal film in the aftermentioned Inventive Example 9 to binarization processing. The size of the image is set to 400 µm□, as with FIG. 5. Although the following description will be made with reference to FIG. 7, it should be noted that the crack rate of the linear cracks in FIG. 5 can also be calculated in the same manner.

First of all, with regard to the image in FIG. 7, in a region between a first straight line having an arbitrarily-set given angle and a second straight line rotated with respect to the first straight line about an arbitrary point as an intersecting point with the first straight line, in a given direction by 2°, a plurality of straight lines each passing through the arbitrary point are drawn one-by-one every time an angle with respect to the first straight line increases by 0.1°, and a total of lengths of linear cracks overlapping the plurality of straight lines and lines parallel to the plurality of straight lines (except for the second straight line and lines parallel to the second straight line) is measured (this total will hereinafter be referred to as "subtotal length"). Subsequently, the above second straight line is defined as a new first straight line, and a straight line rotated with respect to the new first straight line about the arbitrary point in the given direction by 2° is defined as a new second straight line, the total length is determined in the same manner. The same operation is repeatedly performed over 360° to obtain total 90 values of the subtotal length.

Subsequently, the 90 values of the total length are summed up to obtain a final total length of the linear cracks (hereinafter referred to as "total length").

Further, among the 90 values of the subtotal length, a region having the largest "subtotal length" (this region will hereinafter be referred to as "maximum region") is extracted.

Further, a sum of lengths of linear cracks lying within the range of ±5° with respect to a straight line located intermediate between the first and second straight lines defining the maximum region (this straight line will hereinafter be referred to as "reference straight line"). More specifically, the subtotal length in the maximum region, a subtotal length in a first adjacent region rotated with respect to the maximum region in a given direction by 2°, a subtotal length in a second adjacent region further rotated with respect to the first adjacent region in the given direction by 2°, a subtotal length in a third adjacent region rotated with respect to the maximum region in a direction opposite to the given direction by 2° and a subtotal length in a fourth adjacent region further rotated with respect to the third adjacent region in the opposite direction by 2° are summed (this sum will hereinafter be referred to as "inclusive subtotal length".

The "crack ratio" is a ratio of the "inclusive subtotal length" to the "total length", i.e., Crack ratio (%)=Inclusive subtotal length (μm)/Total length (μm).

The crack ratio is correlated with the polarization degree. From a viewpoint of directionality, a larger value of the crack ratio is more desirable. Specifically, the crack ratio is preferably in the range of 80% to 100%, more preferably in the range of 90% to 100%, further preferably in the range of 95% to 100%, still further preferably in the range of 97% to 100%.

On the other hand, when the polarization degree and/or the crack ratio become larger, an electromagnetic wave is largely blocked, resulting in deterioration in the electromagnetic wave transmissibility. As above, the polarization degree and the electromagnetic wave transmissibility are in a trade-off relationship. Thus, from a viewpoint of the electromagnetic wave transmissibility, the polarization degree or the crack ratio is preferably set to a moderately small value. From the viewpoint of the electromagnetic wave transmissibility, the crack ratio is preferably equal to or less than 65%, more preferably equal to or less than 62%. Although a lower limit is not particularly limited, it is preferably equal to or greater than 30%, more preferably equal to or greater than 40%, further preferably equal to or greater than 50%, in view of a balance with the directionality.

A result of the evaluations is presented in the following Table 3. The items "Metal Layer", "Crack Layer" and "Visible Light Reflectance" are the same as those described with reference to Table 2. In regard to conditions for the crack forming processing, the number of times of bending and the diameter of the metal rod around which the substrate film and others are wound are changed. In Inventive Examples 6 to 8, no value is indicated in the field "Mohs hardness". This is simply because it was difficult to measure an accurate value of the Mohs hardness, but does not mean the Mohs hardness is small. A material for the crack layer has a Mohs hardness of at least 4 or more which is sufficiently greater than the Mohs hardness of a material for the metal layer. It should be noted that values of the polarization degree in Table 3 were calculated based on actual data, and do not exactly conform to values of T1/T2 in Table 3 because of significant figures (significant digits).

TABLE 3

| | Metal Layer | | | | Crack Layer | | | |
|---|---|---|---|---|---|---|---|---|
| | Layer Configuration | Material | Mohs Hardness | Thickness (nm) | Layer Structure | Material | Mohs Hardness | Thickness (nm) |
| Inventive Example 5 | upper | Al | 2.5 | 50 | lower | $Al_2O_3$ | 9 | 50 |
| Inventive Example 6 | upper | Al | 2.5 | 50 | lower | STO | — | 50 |
| Inventive Example 7 | upper | Al | 2.5 | 50 | lower | AZO | — | 50 |
| Inventive Example 8 | upper | Cu | 3 | 50 | lower | ITO | — | 50 |
| Inventive Example 9 | lower | Al | 2.5 | 20 | upper | Cr | 8.5 | 45 |
| Comparative Example 9 | upper | Al | 2.5 | 50 | lower | $Al_2O_3$ | 9 | 50 |

| | Conditions for Crack Forming Processing | | | Electromagnetic Wave Transmission | | | |
|---|---|---|---|---|---|---|---|
| | Number of Times of Bending (time) | Rod Diameter (mm) | Visible Light Reflectance (%) | Attenuation Amount (dB) (Transmissivity) | | Polarization Degree (T1/T2) | Crack Ratio (%) |
| | | | | Transmission Axis (T1) | Blocking Axis (T2) | | |
| Inventive Example 5 | 2 | 6 | 77.1 | −2.6 (55.6) | −36.7 (0.02) | 2599 | 97 |
| Inventive Example 6 | 60 | 6 | 75.6 | −2.4 (57.0) | −39.3 (0.01) | 4822 | 98 |
| Inventive Example 7 | 60 | 6 | 73.2 | −4.6 (35.0) | −39.7 (0.01) | 3229 | 97 |
| Inventive Example 8 | 60 | 2 | 44.0 | −2.3 (59.4) | −42.6 (0.005) | 10872 | 99 |

TABLE 3-continued

| | | | | | | | |
|---|---|---|---|---|---|---|---|
| Inventive Example 9 | 2 | 6 | 53.5 | −0.6 (87.1) | −15.4 (2.9) | 30 | 62 |
| Comparative Example 9 | — | — | 77.8 | −37.7 (0.02) | −37.5 (0.02) | 1 | 0 |

Inventive Example 5

First of all, a multi-layered film having the same configuration as that in Inventive Example 2 was prepared in the same manner as that in Inventive Example 2. Subsequently, the multi-layered film was subjected to the bending and stretching processing using the 6 mm-diameter metal rod, as with Inventive Example 2. However, differently from Inventive Example 2, this bending and stretching processing was performed by repeating the reciprocating feeing in the longitudinal direction "β" 2 times. As a result, the same optical microscopic image as that presented in FIG. 4 was obtained, and the same binarized image as that presented in FIG. 5 was obtained.

In this case, regarding linear cracks included in a plane equivalent to the unit area (400 μm□) presented in FIG. 5, the total length and the inclusive subtotal length were, respectively, 4317 μm and 4167 μm, i.e., a high crack ratio of 97% could be obtained. In addition, the polarization degree correlated with the crack ratio also had a good value of 2599, which shows that a resulting metal film or metal member has a high polarization property.

Further, good results were obtained with regard to the visible light reflectance and the radio wave transmission attenuation amount. That is, a metal film or a metal member having both a metallic luster and an electromagnetic wave transmissibility could be obtained.

Inventive Example 6

Differently from Inventive Example 5, a 50 nm-thick STO (sulfated tin oxide) layer was used as the crack layer serving as a lower layer. Further, differently from Inventive Example 5, the bending and stretching processing was performed by repeating the reciprocating feeing in the longitudinal direction "β" "60 times". The remaining conditions are the same as those in Inventive Example 5.

In this case, regarding linear cracks included in a plane equivalent to the unit area (400 μm□) presented in FIG. 5, the total length and the inclusive subtotal length were, respectively, 4423 μm and 4326 μm, i.e., a high crack ratio of 98% could be obtained. In addition, the polarization degree correlated with the crack ratio also had a large value of 4822, which shows that a resulting metal film or metal member has a high polarization property. Further, good results were obtained with regard to the visible light reflectance and the radio wave transmission attenuation amount.

Inventive Example 7

Differently from Inventive Example 5, a 50 nm-thick AZO (aluminum-doped zinc oxide) layer was used as the crack layer serving as a lower layer. Further, differently from Inventive Example 5, the bending and stretching processing was performed by repeating the reciprocating feeing in the longitudinal direction "β" "60 times". The remaining conditions are the same as those in Inventive Example 5.

In this case, regarding linear cracks included in a plane equivalent to the unit area (400 μm□) presented in FIG. 5, the total length and the inclusive subtotal length were, respectively, 3861 μm and 3762 μm, i.e., a high crack ratio of 97% could be obtained. In addition, the polarization degree correlated with the crack ratio also had a large value of 3229, which shows that a resulting metal film or metal member has a high polarization property. Further, good results were obtained with regard to the visible light reflectance and the radio wave transmission attenuation amount.

Inventive Example 8

Differently from Inventive Example 5, a 50 nm-thick copper (Cu) layer was used as the metal layer serving as an upper layer, and a 50 nm-thick ITO layer was used as the crack layer serving as a lower layer. Here, ITO is a complex oxide in which $SnO_2$ is contained in $In_2O_3$ in an amount of 10 wt %, as with Inventive Example 1. Further, differently from Inventive Example 5, the bending and stretching processing was performed by repeating the reciprocating feeing in the longitudinal direction "β" "60 times". The remaining conditions are the same as those in Inventive Example 5.

In this case, regarding linear cracks included in a plane equivalent to the unit area (400 μm□) presented in FIG. 5, the total length and the inclusive subtotal length were, respectively, 5582 μm and 5572 μm, i.e., a high crack ratio of 99% could be obtained. In addition, the polarization degree correlated with the crack ratio also had a significantly large value of 10872, i.e., a very good result could be obtained with regard to the polarization property. A good result was obtained with regard to the radio wave transmission attenuation amount although a result regarding the visible light reflectance was inferior to those in Inventive Example 5, etc.

Inventive Example 9

Differently from Inventive Example 5, the crack layer and the metal layer are arranged, respectively, as an upper layer and a lower layer. Although an aluminum (Al) layer was used as the metal layer as with Inventive Example 5, the thickness thereof was set to 20 μm. On the other hand, a 45 μm-thick chromium (Cr) layer was used as the crack layer, differently from Inventive Example 5. Regarding the bending and stretching processing, the reciprocating feeing was performed 2 times, as with Inventive Example 1. The remaining conditions are the same as those in Inventive Example 1. An image obtained by subjecting an optical microscopic image of a surface of a metal film produced in this Inventive Example 9 to binarization processing is provided as the aforementioned image in FIG. 7.

In this case, regarding linear cracks included in a plane equivalent to the unit area (400 μm□) presented in FIG. 5, the total length and the inclusive subtotal length were, respectively, 9762 μm and 6079 μm, i.e., the crack ratio was 627%. In addition, the polarization degree correlated with the crack ratio had a relatively small value of 30. As above, the results regarding the crack ratio and the polarization degree were inferior to Inventive Example 5, etc. On the other hand, the radio wave transmission attenuation amount was −0.6 dB, i.e., a result better than that in Inventive Example 5, etc., could be obtained with regard to the electromagnetic wave transmissibility. Further, good results were obtained with regard to the visible light reflectance and the radio wave transmission attenuation amount.

Comparative Example 9

Differently from Inventive Example 5, the bending and stretching processing was not performed. The remaining conditions are the same as those in Inventive Example 5.

In this case, a result regarding the electromagnetic wave transmissibility was insufficient, although a good result could be obtained with regard to the metallic luster.

8. Evaluation

As is clear from the above Inventive Examples and Comparative Examples, a result satisfying both the metallic luster and the electromagnetic wave transmissibility could not be obtained by only one of the metal layer and the crack layer (Comparative Examples 5 to 8). Thus, it is necessary to provide at least both of the metal layer and the crack layer.

Further, even in the case where the metal layer and the crack layer are provided, a good result could not be obtained when the bending and stretching processing was not performed (Comparative Examples 1 to 3, 5, 7 and 9), or the heating processing was performed (Comparative Example 4).

Further, when the metal layer has a thickness greater than that of the crack layer (Inventive Example 1, Comparative Example 1, Inventive Example 2 and Comparative Example 2), a good result is less likely to be obtained, although it would depend on a difference in Mohs hardness therebetween.

Further, when forming linear cracks in a lattice pattern (gridiron pattern) by generating not only in the cross direction intersecting the longitudinal direction but also the longitudinal direction (Inventive Example 3), a result was obtained in which the electromagnetic wave transmissibility was further improved.

Further, it was proven that an excellent polarization property can be obtained (Inventive Examples 5 to 8), and, on the other hand, a good electromagnetic wave transmissibility can be obtained in the case where the polarization property is not so good (Inventive Example 9).

It should be understood that the present invention is not limited to the above examples, but may be appropriately modified and implemented without departing from the spirit and scope of the present invention as set forth in appended claims.

INDUSTRIAL APPLICABILITY

The metal film or the metal member of the present invention can be suitably used, for example, to decorate a cover member of a millimeter-wave radar mounted to a front end of an automotive vehicle such as a front grille, an emblem or a bumper. Further, it can be used as a radar cover such as a radome, or a polarized antenna for a base station or the like. However, it is to be understood that application targets of the present invention are not limited thereto but may include various other articles requiring both an aesthetic quality and an electromagnetic wave transmissibility, such as a mobile phone, a smart phone, a tablet PC, a notebook PC, and a refrigerator.

LIST OF REFERENCE SIGNS

1: metal member
3, 3A: metal film
10: substrate film
11: metal layer
11': linear crack
12: crack layer
12': linear crack
15: linear crack
20: multi-layered film

The invention claimed is:

1. An electromagnetic wave transmissive metal member comprising a metal layer and a crack layer, wherein
the metal layer and the crack layer have, in their respective planes, a plurality of linear cracks extending substantially parallel to each other,
the linear cracks in the metal layer and the linear cracks in the crack layer penetrate through their respective layers in a thickness direction, and are continuous with each other in the thickness direction,
the linear cracks are formed in the metal layer and the crack layer by bending and stretching a multi-layered film obtained by laminating the metal layer and the crack layer on a substrate film, in at least one direction in a state in which the multi-layered film is folded toward a side of the substrate film, and
a thickness of the metal layer is greater than 30 nm and less than or equal to 1000 nm, and a visible light reflectance of the electromagnetic wave transmissive metal member is greater than 40%.

2. The electromagnetic wave transmissive metal member as recited in claim 1, wherein
an angle made by adjacent two of the linear cracks included in the plane of at least one of the metal layer and the crack layer with respect to an edge of the metal layer or the crack layer is within the range of ±10°.

3. The electromagnetic wave transmissive metal member as recited in claim 1, wherein 40% or more of angles, each of the angles being made by two linear cracks which are arbitrarily selected from among a plurality of linear cracks included in a 400 μm square-plane of the metal layer or the crack layer, with respect to an edge of the metal layer or the crack layer, are within the range of ±10°.

4. The electromagnetic wave transmissive metal member as recited in claim 3, wherein, as for the two linear cracks which are arbitrarily selected from among a plurality of linear cracks included in a 400 μm square-plane of the metal layer or the crack layer, 40% or more of the angles, each of the angles being made by the selected two linear cracks, with respect to the edge of the metal layer or the crack layer, are within the range of ±10°, and 40% or more of the angles are in the range of 80° to 100°.

5. The electromagnetic wave transmissive metal member as recited in claim 1, wherein 80% or more of the plurality of linear cracks included in a 400 μm square-plane of the metal layer or the crack layer, lie at an angle with respect to an edge of the metal layer or the crack layer within the range of ±5° of an angle between a reference straight line extending in a direction transverse to the edge of the metal layer or the crack layer.

6. The electromagnetic wave transmissive metal member as recited in claim 1, wherein a rate of linear cracks lying at an angle with respect to an edge of the metal layer or the crack layer within the range of ±5° of an angle between a reference straight line extending in a direction transverse to the edge of the metal layer or the crack layer, among a plurality of linear cracks included in a 400 µm-square plane of the metal layer or the crack layer, is equal to or less than 70%.

7. The electromagnetic wave transmissive metal member as recited in claim 1, wherein the linear cracks are formed in the metal layer and the crack layer by bending and stretching the multi-layered film in a plurality of directions.

8. The electromagnetic wave transmissive metal member as recited in claim 1, wherein each of the linear cracks has a length along a corresponding plane of the metal layer or the crack layer of 200 µm or more.

9. The electromagnetic wave transmissive metal member as recited in claim 1, wherein the metal layer or the crack layer comprises a material such that the linear cracks are generated in the metal layer and the crack layer by bending the metal layer and the crack layer around a given curvature when the multi-layered film is folded toward the side of the substrate film, and the linear cracks in at least one of the metal layer or the crack layer have a maximum width of 0.1 nm to 100 nm while the metal layer and the crack layer are being bent around the given curvature and have a reduced width less than the maximum width when the metal layer and the crack layer are in a flattened state after the metal layer and the crack layer are bent around the given curvature.

10. The electromagnetic wave transmissive metal member as recited in claim 1, wherein a ratio of a thickness of the metal layer to a thickness of the crack layer is from 0.1 to 20.

11. The electromagnetic wave transmissive metal member as recited in claim 1, wherein the crack layer has a thickness of 5 nm to 5000 nm.

12. The electromagnetic wave transmissive metal member as recited in claim 1, wherein the crack layer is made of a substance containing at least one selected from the group consisting of a metal having a Mohs hardness of 4 or more, an alloy comprising a primary component consisting of the metal, and ceramics.

13. The electromagnetic wave transmissive metal member as recited in claim 12, wherein the ceramics contains any of an oxide, a nitride, a carbide and an oxynitride of an element including at least one selected from the group consisting of a metal, silicon, and boron.

14. The electromagnetic wave transmissive metal member as recited in claim 1, wherein the metal layer has a Mohs hardness of 1 to less than 4.

15. The electromagnetic wave transmissive metal member as recited in claim 14, wherein the metal layer contains either of at least one metal selected from the group consisting of Al, Cu, Ag, Au, and Zn, and an alloy comprising a primary component consisting of the metal.

16. An electromagnetic wave transmissive metal film comprising the electromagnetic wave transmissive metal member as recited in claim 1, and the substrate film.

17. An electromagnetic wave transmissive metal member-equipped resin component comprising the electromagnetic wave transmissive metal member as recited in claim 1, and a molded resin substrate.

18. An on-vehicle radar device using the electromagnetic wave transmissive metal member as recited in claim 1.

19. A radar cover comprising the electromagnetic wave transmissive metal member as recited in claim 5.

20. A polarized wave antenna comprising the electromagnetic wave transmissive metal member as recited in claim 5.

21. A method of producing an electromagnetic wave transmissive metal film, comprising:
bending and stretching a multi-layered film comprising a substrate, a metal layer over the substrate, and a crack layer over the substrate to form a plurality of linear cracks in the multi-layered film, the linear cracks being substantially parallel to each other and extending in a longitudinal direction of the multi-layered film,
wherein
the multi-layered film is bent and stretched in a state in which the multi-layered film is folded toward a side of the multi-layered film along a cross direction intersecting the longitudinal direction,
the bending and stretching causes the linear cracks in the metal layer and the linear cracks in the crack layer to penetrate through their respective layers in a thickness direction, and to be continuous with each other in the thickness direction, and
a thickness of the metal layer is greater than 30 nm and less than or equal to 1000 nm, and a visible light reflectance of the electromagnetic wave transmissive metal member is greater than 40%.

22. An on-vehicle radar device using the electromagnetic wave transmissive metal film as recited in claim 16.

23. An on-vehicle radar device using the electromagnetic wave transmissive metal member-equipped resin component as recited in claim 17.

* * * * *